(12) United States Patent
Oka et al.

(10) Patent No.: US 8,319,333 B2
(45) Date of Patent: Nov. 27, 2012

(54) POWER SEMICONDUCTOR MODULE

(75) Inventors: Seiji Oka, Tokyo (JP); Yoshiko Obiraki, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 550 days.

(21) Appl. No.: 12/582,025

(22) Filed: Oct. 20, 2009

(65) Prior Publication Data

US 2010/0127383 A1 May 27, 2010

(30) Foreign Application Priority Data

Nov. 25, 2008 (JP) ................................. 2008-298988

(51) Int. Cl.
H01L 23/48 (2006.01)

(52) U.S. Cl. ........ 257/697; 257/698; 257/693; 257/150; 257/177; 438/121; 438/122; 438/124; 438/126; 438/127

(58) Field of Classification Search .................. 257/697, 257/698, 693, 150, 177; 438/121, 122, 124, 438/126, 127
See application file for complete search history.

(56) References Cited

U.S. PATENT DOCUMENTS

| | | | | |
|---|---|---|---|---|
| 5,721,455 A | * | 2/1998 | Takashita | ...................... 257/713 |
| 6,100,585 A | * | 8/2000 | Chiba | ........................... 257/734 |
| 7,791,177 B2 | * | 9/2010 | Wieneke Kessler et al. | . 257/666 |
| 2007/0215999 A1 | * | 9/2007 | Kashimoto et al. | ........... 257/678 |
| 2010/0117219 A1 | | 5/2010 | Oka et al. | |

FOREIGN PATENT DOCUMENTS

| | | |
|---|---|---|
| JP | 2007-184315 | 7/2007 |
| JP | 2007-235004 | 9/2007 |
| WO | WO 2008/090734 A1 | 7/2008 |

OTHER PUBLICATIONS

U.S. Appl. No. 13/086,499, filed Apr. 14, 2011, Oi, et al.
U.S. Appl. No. 13/150,593, filed Jun. 1, 2011, Oka, et al.
U.S. Appl. No. 12/504,225, filed Jul. 16, 2009, Oi, et al.
U.S. Appl. No. 12/504,250, filed Jul. 16, 2009, Obiraki, et al.
U.S. Appl. No. 12/523,948, filed Jul. 21, 2009, Oka, et al.
U.S. Appl. No. 12/535,222, filed Aug. 4, 2009, Oka, et al.
U.S. Appl. No. 12/540,880, filed Aug. 13, 2009, Obiraki, et al.

* cited by examiner

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

In the power semiconductor module, a wiring metal plate electrically connects between power semiconductor elements joined to the circuit pattern, and between the power semiconductor elements and the circuit pattern. Cylindrical main terminals are joined, substantially perpendicularly, to the wiring metal plate and the circuit pattern, respectively. A cylindrical control terminal is joined, substantially perpendicularly, to one of the power semiconductor elements.

9 Claims, 8 Drawing Sheets

POWER SEMICONDUCTOR MODULE

BACKGROUND OF THE INVENTION

1. Field of the Invention

The present invention relates to a power semiconductor module, sealed with resin by transfer molding, which is excellent in terms of productivity. The present invention particularly relates to a power semiconductor module, with a reduced size, which is sealed with resin by transfer molding.

2. Description of the Background Art

One of the resin-sealed power semiconductor modules formed by transfer molding, which is capable of efficiently discharging to the outside the heat generated due to its operation, and capable of large-current operation, is the one in which: power semiconductor elements such as an IGBT and the like are mounted on a circuit pattern joined to a metal heat sink base; and main and control terminals for external connection are joined to the circuit pattern so as to be substantially perpendicular to a surface of the circuit pattern.

A copper block, a cylinder having a screw hole, and a nut fixed by resin molding, are each used for a main terminal connected to a main circuit of this power semiconductor module. The main terminal that is a copper block is joined to external wiring by soldering. The main terminal that is a cylinder having a screw hole, or the main terminal in which a nut is fixed by resin molding, is connected to external wiring by a bolt. Further, a female connector is used as a control terminal that connects to a control circuit of the power semiconductor module, and the female connector is connected to a pin-type terminal provided on an external control substrate.

These main and control terminals are each provided so as to be substantially perpendicular to the circuit pattern surface. Portions of these terminals, which connect to external wiring, are exposed at a surface of the molded resin. Further, wire bonding electrically connects between a power semiconductor element and the main terminal, between a power semiconductor element and the control terminal, and between the power semiconductor elements (see, e.g., Page 7 to 9, FIGS. 2 and 6 of Japanese Laid-Open Patent Publication No. 2007-184315 (hereinafter, referred to as Patent Document 1)).

In the power semiconductor module sealed with transfer molding resin which is described in Patent Document 1 (hereinafter, simply referred to as a power semiconductor module), the wire bonding electrically connects between a power semiconductor element and a circuit pattern on which the main terminals are provided, between a power semiconductor element and a circuit pattern on which the control terminal is provided, and between the power semiconductor elements.

In the power semiconductor module described in Patent Document 1, the wire bonding is used for wiring within the power semiconductor module. For this reason, other than the circuit pattern on which the power semiconductor elements are mounted, the circuit patterns, on which the main and control terminals are mounted, are provided. This causes a problem that size reduction of the power semiconductor module is restricted.

Since a predetermined wide space is necessary for the header of a wire bonding equipment to operate, it is difficult to perform wire bonding in the vicinity of the main or control terminal. In other words, it is necessary to have a wide space between the main or control terminal and a portion on which the wire bonding is performed, in order to allow the wire bonding equipment to operate. This also causes the problem that size reduction of the power semiconductor module is restricted.

The present invention solves the above problem. The object of the present invention is to provide a power semiconductor module, sealed with resin by transfer molding, which can be further reduced in size.

SUMMARY OF THE INVENTION

A power semiconductor module according to the present invention includes: a circuit substrate including a metal heat sink and including a high thermal conductive insulation layer joined to one surface of the metal heat sink and including a circuit pattern provided on a surface of the high thermal conductive insulation layer, which surface is opposite to a surface joined to the metal heat sink; power semiconductor elements joined to the circuit pattern; a wiring metal plate for electrically connecting between the power semiconductor elements and between the power semiconductor elements and the circuit pattern; cylindrical main terminals that are joined, substantially perpendicularly, to the wiring metal plate and the circuit pattern, respectively; a cylindrical control terminal that is joined, substantially perpendicularly, to one of the power semiconductor elements; and transfer molding resin for sealing, at least, the high thermal conductive insulation layer, the circuit pattern, the power semiconductor elements, the wiring metal plate, outer side surfaces of the main terminals, and an outer side surface of the control terminal. The main and control terminals each have an opening provided at a surface of the transfer molding resin. Since the power semiconductor module according to the present invention has the above configuration, the power semiconductor module can be further reduced in size.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Figure 1:
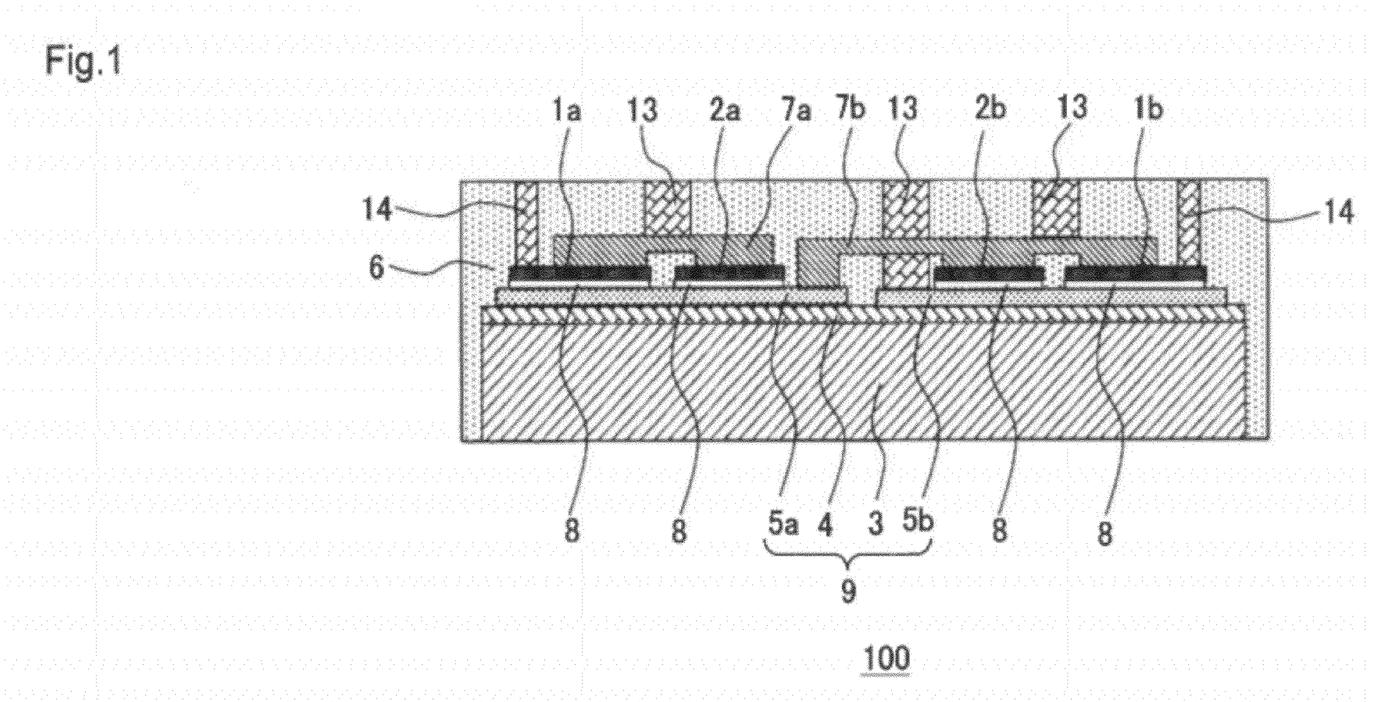
FIG. 1 is a schematic cross-sectional view showing a power semiconductor module according to the first embodiment of the present invention.

FIG. 1 is a schematic cross-sectional view showing a power semiconductor module according to the first embodiment of the present invention.

As shown in FIG. 1, in a power semiconductor module 100 of the present embodiment, an insulation sheet 4, which is a high thermal conductive insulation layer, is provided on one surface of a metal base plate 3 that acts as a metal heat sink for dissipating heat of the power semiconductor module 100. A first metal pattern 5a and a second metal pattern 5b, which are circuit patterns, are provided on a surface of the insulation sheet 4, which surface is opposite to a surface joined to the metal base plate 3.

That is, the metal base plate 3, the resin sheet 4, and the first and second metal patterns 5a and 5b constitute a metal substrate 9 that is a circuit substrate.

Power semiconductor elements that are a first IGBT chip 1a and a first FWD (Free Wheeling Diode) chip 2a are joined onto the first metal pattern 5a by solder 8. Power semiconductor elements that are a second IGBT chip 1b and a second FWD chip 2b are joined onto the second metal pattern 5b by the solder 8. In other words, the power semiconductor module 100 of the present embodiment is a 2-in-1 IGBT module in which two sets of IGBT chips and FWD chips are mounted on the metal substrate 9.

A surface of the first IGBT chip 1a, which surface is opposite to a surface joined to the first metal pattern 5a, and a surface of the first FWD chip 2a, which surface is opposite to a surface joined to the first metal pattern 5a, are joined via a first wiring metal plate 7a. A surface of the second IGBT chip 1b, which surface is opposite to a surface joined to the second metal pattern 5b; a surface of the second FWD chip 2b, which surface is opposite to a surface joined to the second metal pattern 5b; and the first metal pattern 5a, are joined via a second wiring metal plate 7b.

A cylindrical terminal 13 (hereinafter, referred to as a main terminal 13) connected to a main circuit of the power semiconductor module 100 is provided on the first wiring metal plate 7a, on the second wiring metal plate 7b, and on the second metal pattern 5b, such that the cylindrical terminals 13 are substantially perpendicular to a surface of the metal substrate 9. A cylindrical terminal 14 (hereinafter, referred to as a control terminal 14) connected to a control circuit of the power semiconductor module 100 is provided, substantially perpendicularly, on the gate of each of the IGBT chips 1a and 1b.

The surface of the metal substrate 9 of the power semiconductor module 100, on which surface the metal patterns are formed; peripheral side surfaces of the metal substrate 9; all the power semiconductor elements 1a, 1b, 2a and 2b; all the wiring metal plates 7a and 7b; and outer side surfaces of the main terminals 13 and the control terminals 14, are sealed with transfer molding resin 6. However, a surface of the metal base plate 3, which is opposite to the surface having the insulation sheet 4 provided thereon, is not sealed with the transfer molding resin 6, and holes of the main terminals 13 and the control terminals 14 are not filled with the transfer molding resin 6.

In the present embodiment, the first IGBT chip 1a and the first FWD chip 2a are joined via the first wiring metal plate 7a; the second IGBT chip 1b, the second FWD chip 2b, and the first metal pattern 5a are joined via the second wiring metal plate 7b; and the main terminal 13 is provided on the second metal pattern 5b. Alternatively, the first IGBT chip 1a, the first FWD chip 2a, and the second metal pattern 5b may be joined via the first wiring metal plate 7a; the second IGBT chip 1b and the second FWD chip 2b may be joined via the second wiring metal plate 7b; and the main terminal 13 may be provided on the first metal pattern 5a.

In the present embodiment, metal having excellent thermal conductivity, such as aluminum or copper, may be used for the metal base plate 3. Also, a resin insulation sheet, containing various ceramics and inorganic powder, which has excellent thermal conductivity is used as the insulation sheet 4.

For example, a copper plate is used for the first metal pattern 5a and the second metal pattern 5b. A copper material is also used for, e.g., the first wiring metal plate 7a and the second wiring metal plate 7b.

Further, cylindrical and electrically conductive components, for example, metal cylinders, are used as the main terminals 13 and the control terminals 14. Epoxy resin filled with silica powder filler, for example, is used as the transfer molding resin 6.

Described next is an example of a manufacturing method of the power semiconductor module of the present embodiment.

First, the metal base plate 3, the insulation sheet 4 in B-stage, and the copper plate are laminated together. Then, these are heated and pressurized so as to become bonded to each other and form into a laminated body. Next, etching is performed on the copper plate of the laminated body, whereby the first metal pattern 5a and the second metal pattern 5b are formed. In this manner, the metal substrate 9 is completed.

Next, the first IGBT chip 1a and the first FWD chip 2a are joined, by the solder 8 or the like, to the first metal pattern 5a of the metal substrate 9. Also, the second IGBT chip 1b and the second FWD chip 2b are joined, by the solder 8 or the like, to the second metal pattern 5b of the metal substrate 9.

Figure 2:
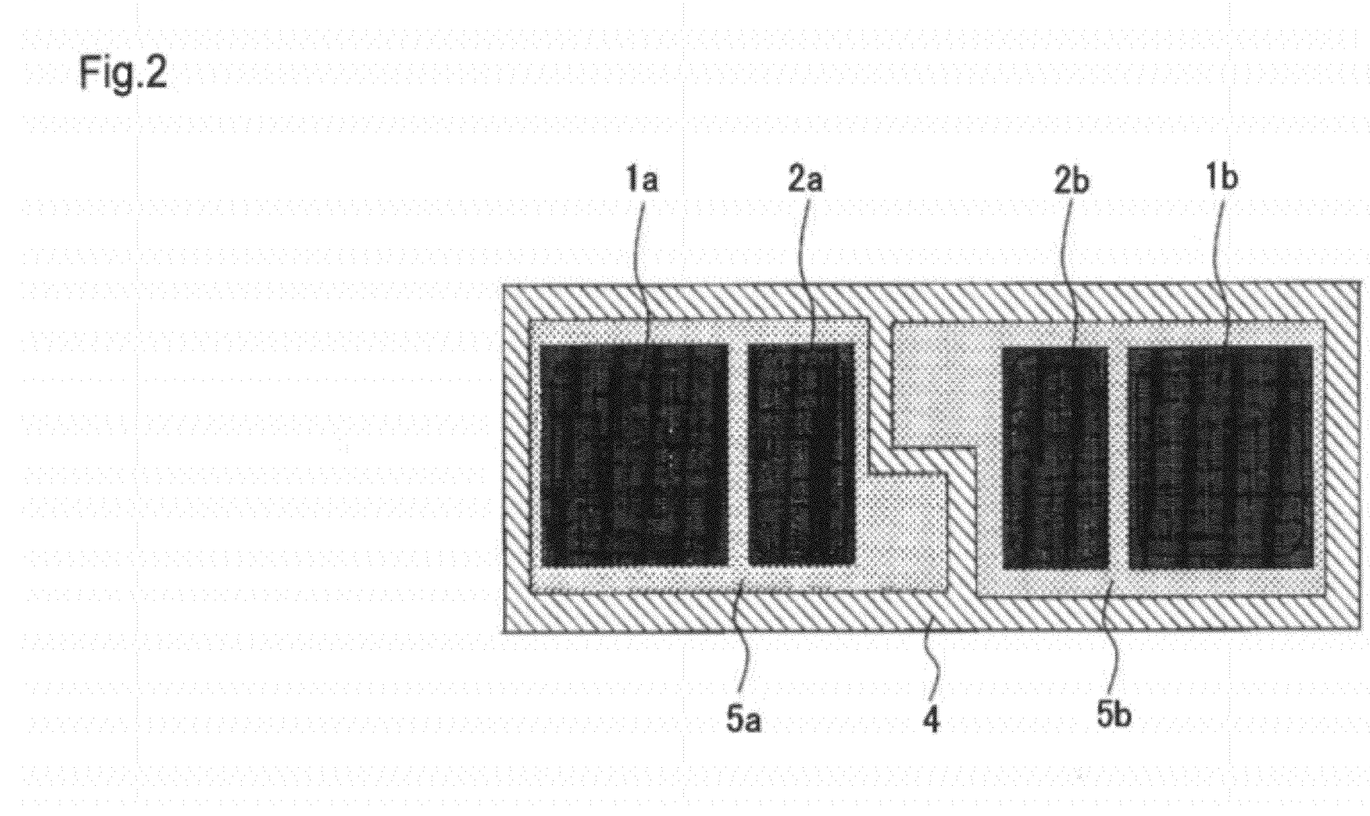
FIG. 2 shows that power semiconductor elements are mounted on metal patterns in a manufacturing process of the power semiconductor module according to the first embodiment of the present invention.

FIG. 2 shows that the power semiconductor elements are mounted on the metal patterns in the manufacturing process of the power semiconductor module according to the first embodiment of the present invention.

As shown in FIG. 2, the first IGBT chip 1a, the first FWD chip 2a, the second FWD chip 2b, and the second IGBT chip 1b are arranged in a row in said order from left to right. Further, the first metal pattern 5a has a laterally projecting portion to which the second wiring metal plate 7b is joined and of which side surfaces are positioned in parallel to side surfaces of a laterally projecting portion of the second metal pattern 5b to which the main terminal 13 is connected. In this manner, a distance between the first metal pattern 5a and the second metal pattern 5b can be reduced, which contributes to the size reduction of the power semiconductor module.

Next, the first wiring metal plate 7a is joined to the first IGBT chip 1a and the first FWD chip 2a by soldering or the like; and the second wiring metal plate 7b is joined to the second IGBT chip 1b, the second FWD chip 2b, and the projecting portion of the first metal pattern 5a by soldering or the like.

Figure 3:
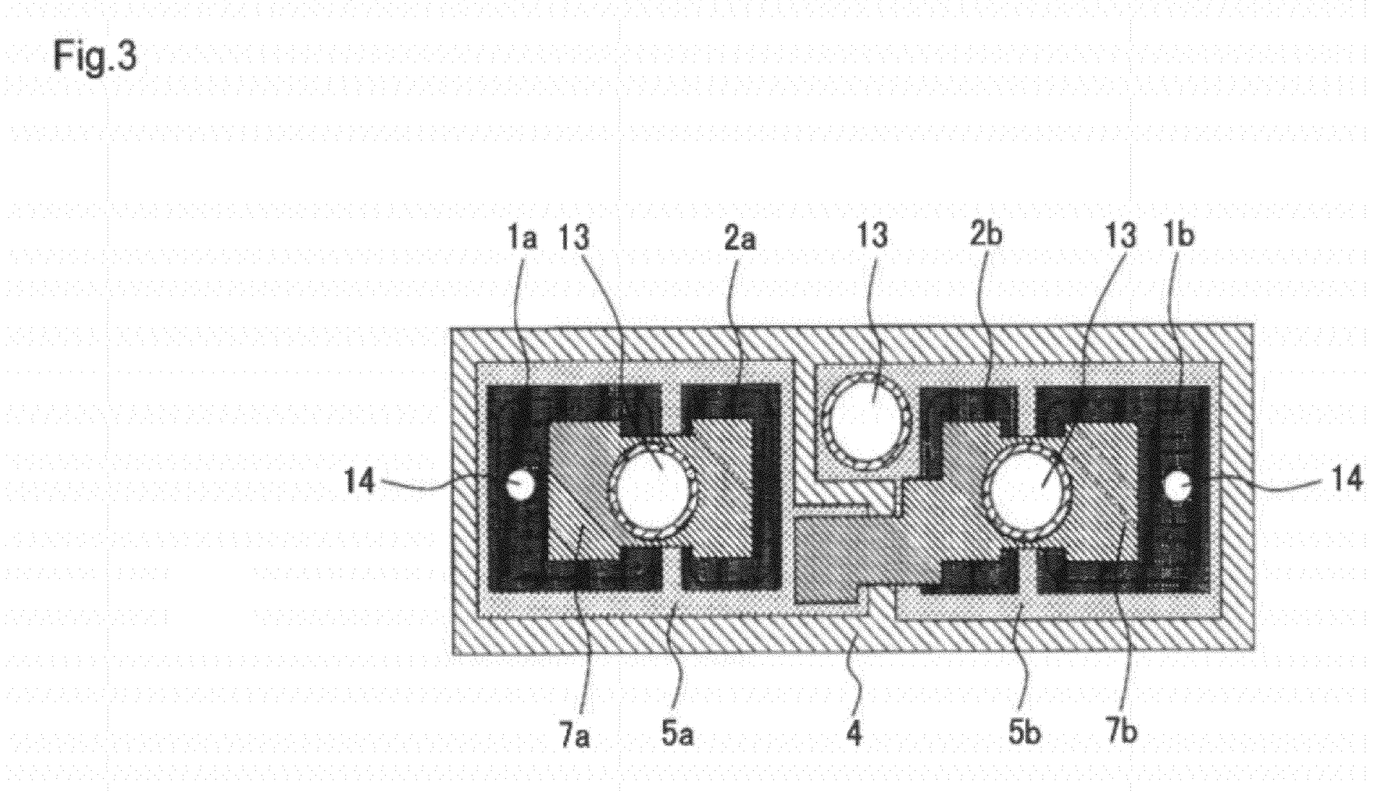
FIG. 3 shows that main terminals and control terminals are fixed in the manufacturing process of the power semiconductor module according to the first embodiment of the present invention.

Next, the main terminals 13 are joined to the first wiring metal plate 7a, the second wiring metal plate 7b and the projecting portion of the second metal pattern 5b by soldering or the like; and the control terminals 14 are joined to the respective gates of the first IGBT chip 1a and the second IGBT chip 1b by soldering or the like.

FIG. 3 shows that the main terminals and the control terminals are fixed in the manufacturing process of the power semiconductor module according to the first embodiment of the present invention.

As shown in FIG. 3, the main terminals 13 to each of which a large current is applied are larger in size than the control terminals 14. Here, the first wiring metal plate 7a and the second wiring metal plate 7b are each a single wide plate.

Finally, a mold is used to perform molding by transfer molding, whereby the power semiconductor module 100 sealed with the transfer molding resin 6 is completed.

Figure 4:
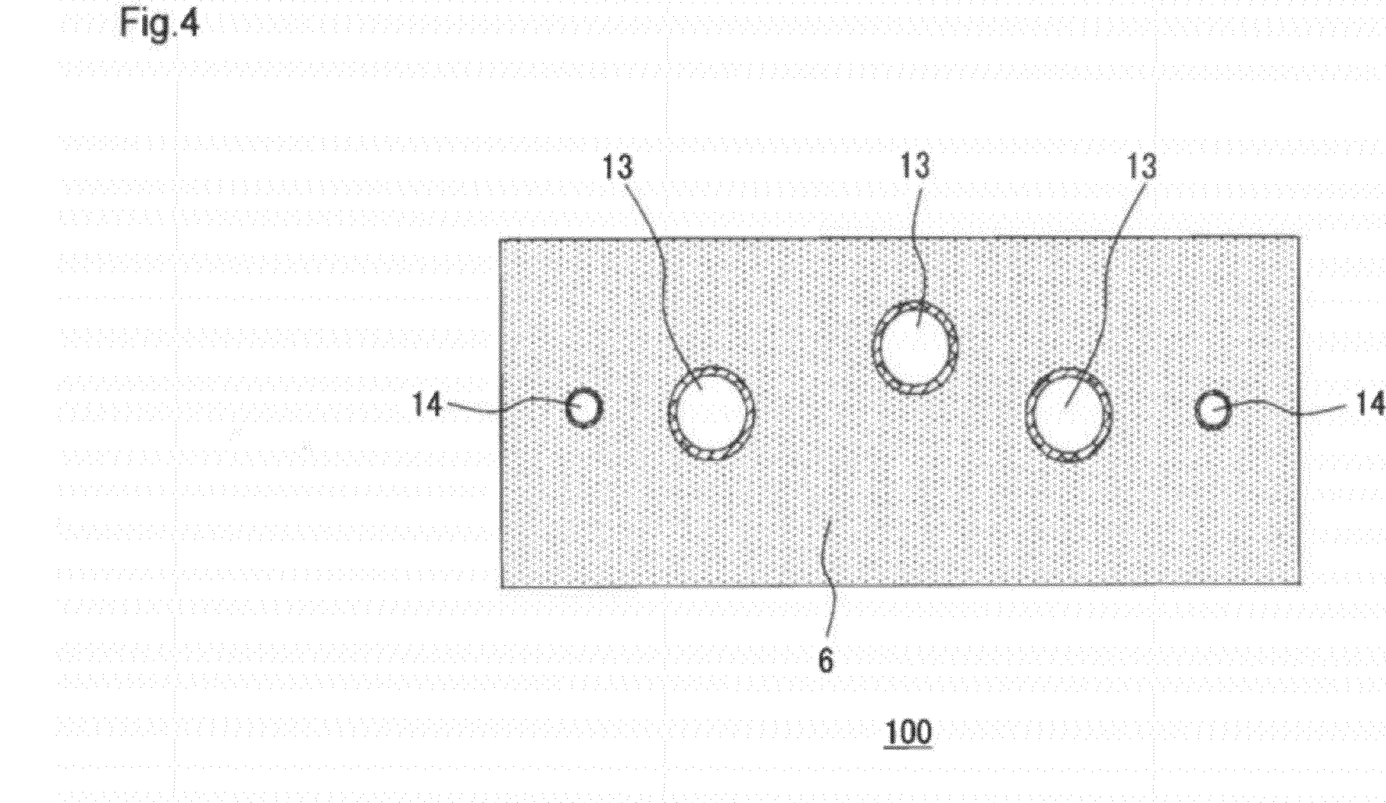
FIG. 4 is a schematic top view of the power semiconductor module according to the first embodiment of the present invention.

FIG. 4 is a top view of the power semiconductor module according to the first embodiment of the present invention.

As shown in FIG. 4, the openings of the main terminals 13 and the control terminals 14 are exposed at a surface of the sealed transfer molding resin 6. An external terminal to be connected to an external circuit can be inserted into each opening.

A method in which the molding is performed such that the openings of the main terminals 13 and the control terminals 14 are exposed at the surface of the sealed transfer molding resin 6 is, for example, the one in which the molding is performed with a tolerance-absorbing thermoplastic sheet placed within the mold.

In the manufacturing process of the power semiconductor module 100 of the present embodiment, the wiring metal plates are joined to the power semiconductor elements after the power semiconductor elements are joined to the respective metal patterns. Thereafter, the main terminals and the control terminals are joined. Alternatively, after the power semiconductor elements, the wiring metal plates, the main terminals, and the control terminals are temporarily bonded using solder paste, reflow soldering for these components can be performed at one time. In this manner, the manufacturing process of the power semiconductor module can be simplified, and the productivity of the power semiconductor module is improved, accordingly.

In the power semiconductor module 100 of the present embodiment, wire bonding is not used for the wiring within the power semiconductor module. Instead, the wiring metal plates are used to join between power semiconductor elements and to join between power semiconductor elements and a metal pattern having power semiconductor elements mounted thereon. Further, main terminals are provided on the wiring metal plates, and control terminals are provided on the IGBT chips. Therefore, it is no longer necessary to separately provide, in addition to the metal patterns having the power semiconductor elements mounted thereon, metal patterns for mounting the main and control terminals thereon. This allows the power semiconductor module to be further reduced in size.

Since wire bonding is not used, a wide space, which a wire bonding equipment requires for its operation, is not necessary. Also in this respect, the power semiconductor module can be further reduced in size.

In the case where wiring is performed by wire bonding in a power semiconductor module having a large current carrying capacity, it is necessary to connect a large number of bonding wires in parallel. This increases the rate of defective connection. However, since a wiring metal plate, instead of wire bonding, is used for wiring in the power semiconductor module 100 of the present embodiment, the rate of defective connection is low. Thus, the power semiconductor module 100 is highly reliable.

The power semiconductor module 100 of the present embodiment is a 2-in-1 IGBT module in which two sets of IGBT chips and FWD chips are mounted on the metal substrate 9. However, this configuration, in which the wiring is formed not by wire bonding but by wiring metal plates and the main terminals are provided on the wiring metal plates and the control terminals are provided on the IGBT elements, is also applicable to a power semiconductor module in which one set of a IGBT chip and a diode chip are mounted on a single metal pattern.

Further, this configuration is also applicable in the case of connecting between the same type of chips, for example, between IGBT chips or between diode chips.

Second Embodiment

Figure 5:
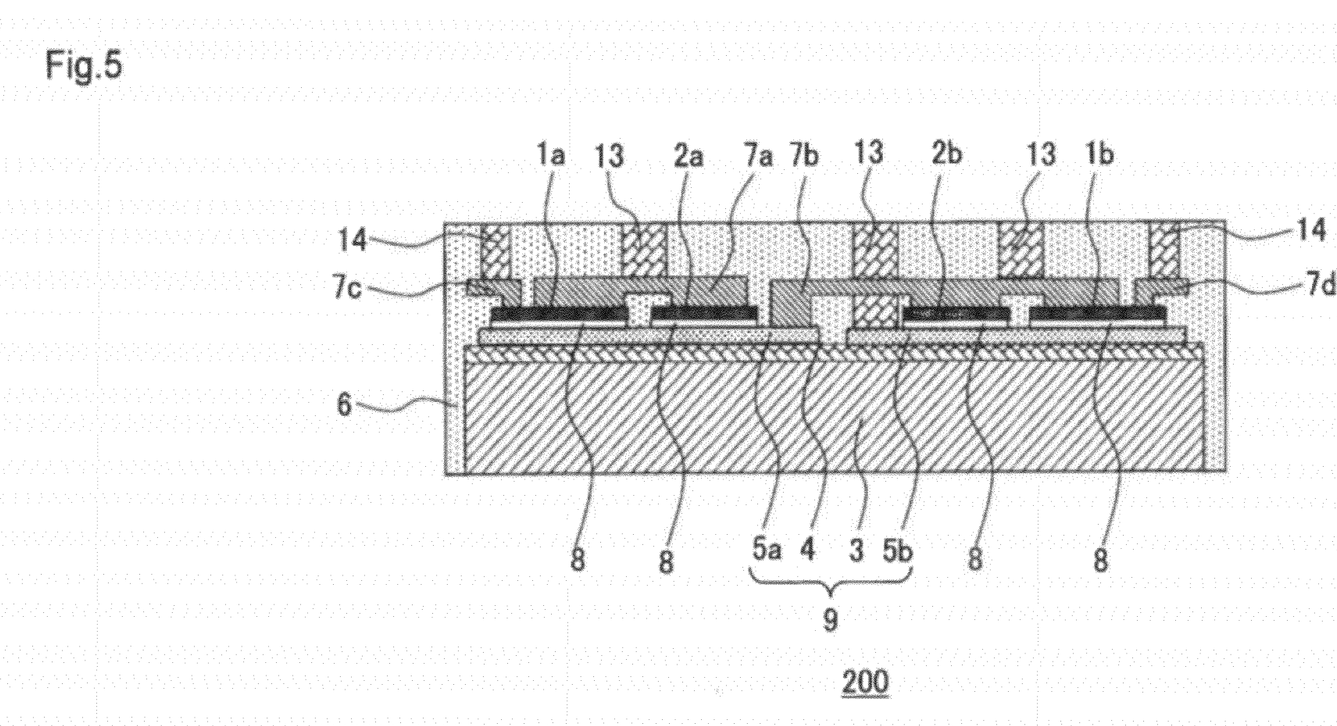
FIG. 5 is a schematic cross-sectional view of a power semiconductor module according to the second embodiment of the present invention.

FIG. 5 is a schematic cross-sectional view of a power semiconductor module according to the second embodiment of the present invention.

As shown in FIG. 5, a power semiconductor 200 of the present embodiment is the same as the power semiconductor module 100 of the first embodiment except that: a third wiring metal plate 7c is joined to the gate of the first IGBT chip 1a; a fourth wiring metal plate 7d is joined to the gate of the second IGBT chip 1b; and the control terminals 14 are joined to the third wiring metal plate 7c and the fourth wiring metal plate 7d, respectively. Here, portions of the third wiring metal plate 7c and the fourth wiring metal plate 7d, which portions are joined to the gates of the IGBT chips, each have the same or smaller dimensions than the corresponding gate. Also, portions of the third wiring metal plate 7c and the fourth wiring metal plate 7d, to which portions the control terminals 14 are joined, each have the same or greater dimensions than the joined portion of the corresponding control terminal 14.

The power semiconductor 200 of the present embodiment provides the same effects as those of the power semiconductor module 100 of the first embodiment. In addition, the control terminals can be provided therein even if IGBT chips of small capacity are used and the gates of the IGBT chips are smaller in dimensions than the joined portions of the control terminals.

Third Embodiment

Figure 6:
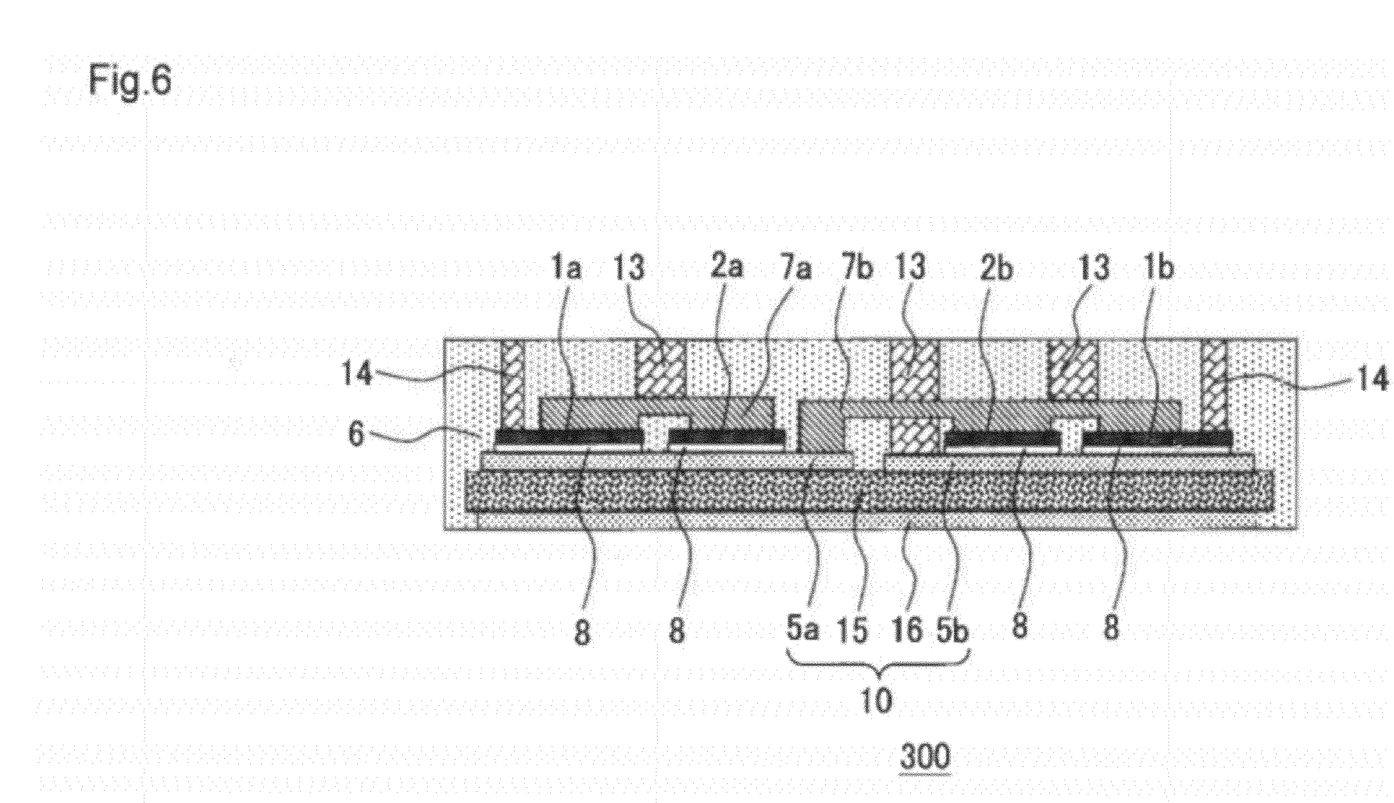
FIG. 6 is a schematic cross-sectional view of a power semiconductor module according to the third embodiment of the present invention.

FIG. 6 is a schematic cross-sectional view of a power semiconductor module according to the third embodiment of the present invention.

As shown in FIG. 6, a power semiconductor module 300 of the present embodiment is the same as the power semiconductor module 100 of the first embodiment except that a ceramic substrate 10 is used as a circuit substrate. In the ceramic substrate 10, a heat-dissipating metal plate 16 acting as a metal heat sink is joined to one face of a ceramic plate 15 that is a high thermal conductive insulation layer, and the first metal pattern 5a and the second metal pattern 5b which are circuit patterns are provided on the other surface of the ceramic plate 15. Preferably, a plate of alumina, aluminum nitride, boron nitride or the like is used as the ceramic plate 15.

The power semiconductor module 300 of the present embodiment provides the same effects as those of the power semiconductor module 100 of the first embodiment. In addition, since the ceramic substrate 10 is used as a circuit substrate, thermal resistance of the power semiconductor module can be further reduced.

The use of the ceramic substrate 10 as a circuit substrate is also applicable in the power semiconductor module 200 of the second embodiment, and the same effects as those of the power semiconductor module 300 can be obtained, accordingly.

Fourth Embodiment

Figure 7:
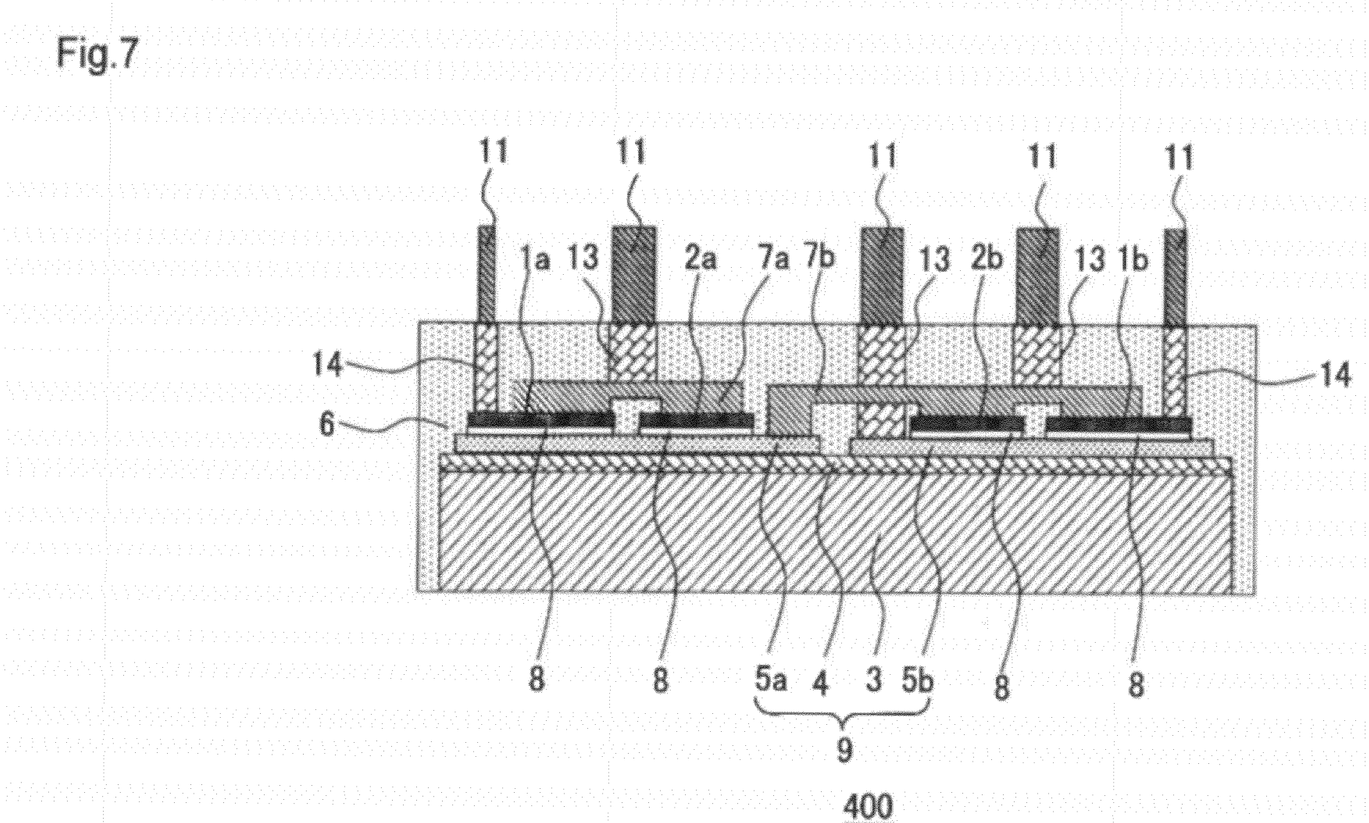
FIG. 7 is a schematic cross-sectional view of a power semiconductor module according to the fourth embodiment of the present invention.

FIG. 7 is a schematic cross-sectional view of a power semiconductor module according to the fourth embodiment of the present invention.

As shown in FIG. 7, a power semiconductor module 400 of the present embodiment is a result of inserting and connecting external terminal pins 11 to the main terminals 13 and the control terminals 14 of the power semiconductor module 100 of the first embodiment.

The power semiconductor module 400 is able to become conductive with an external circuit via the external terminal pins 11 that are each inserted and connected to the main terminal 13 or the control terminal 14.

Figure 8:
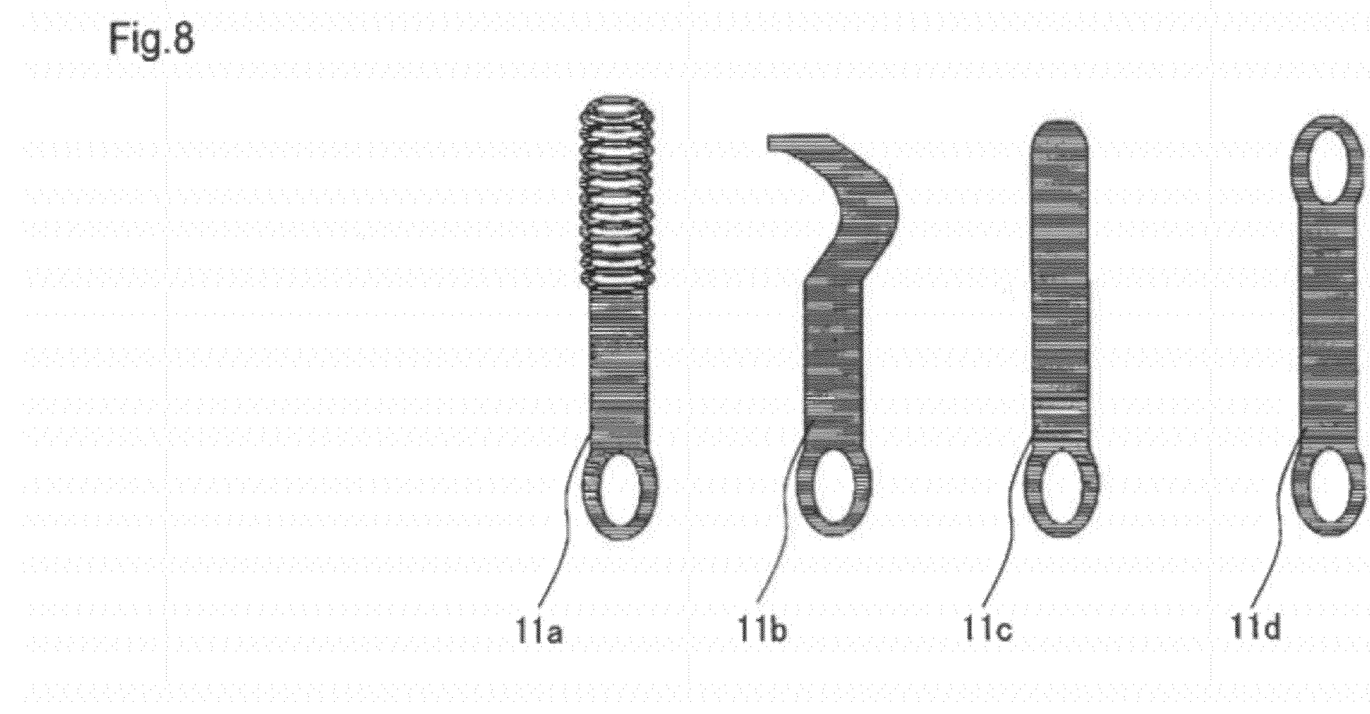
FIG. 8 shows external terminals to be used in the power semiconductor module according to the fourth embodiment of the present invention.

FIG. 8 shows external terminals to be used in the power semiconductor module according to the fourth embodiment of the present invention.

The lower portion of each external terminal pin 11 shown in FIG. 8, which is to be inserted into the main terminal 13 or the control terminal 14, has a shape of a compliant pin, i.e., a press fit structure. Accordingly, each external terminal pin 11 is electrically connected to the main terminal 13 or the control terminal 14 by being fixed thereto through press-in connection. The press fit structure of each external terminal pin 11 may be a star-pin structure or the like.

Preferably, a material used for the external terminal pins 11 is of a copper-alloy type which has a resilient characteristic and whose electrical resistance is small. The cross-sectional sizes of the external terminal pins 11 are properly determined based on current carrying capacity.

The shape of the upper portion of each external terminal pin 11 is determined based on the shape of an external device electrically connected to the power semiconductor module.

In the case where a joint between the power semiconductor module and the external device is formed at a pattern portion of a printed circuit board of the external device, a first external terminal pin 11a of which the upper portion to be joined to the pattern portion has a coil spring shape, or a second external terminal pin 11b of which the upper portion to be joined to the pattern portion has a plate spring shape, is used.

Further, in the case where a joint between the power semiconductor module and the external device is formed at a through hole of the printed circuit board of the external device, a third external terminal pin 11c of which the upper portion to be joined to the through hole has a shape for solder connection, or a fourth external terminal pin 11d of which the upper portion to be joined to the through hole has a shape for press-fit connection, is used.

Although not shown, in the case of high current carrying capacity, the main terminals may be metal cylinders in each of which a female screw is formed, and the external terminal pins may be pins that are each formed in a shape of a male screw, for example.

The power semiconductor module 400 of the present embodiment provides the same effects as those of the power semiconductor module 100 of the first embodiment. In addition, the power semiconductor module 400 can be electrically connected to external devices of different shapes, which provides excellent convenience.

The structure in which the external terminal pins 11 each having a press fit structure are inserted into the main terminals 13 and the control terminals 14, is applicable to the power semiconductors modules 200 and 300 of the second and third embodiments, and the same effects as those of the power semiconductor module 400 can be obtained, accordingly.

In the power semiconductor module according to the present invention, it is not necessary to provide, on a circuit substrate, metal patterns on which the main and control terminals are to be mounted. Accordingly, the power semiconductor module can be reduced in size. Therefore, the present invention can be effectively applied to a power semiconductor device in which power semiconductor modules are mounted with high density.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor module comprising:
   a circuit substrate including a metal heat sink and including a high thermal conductive insulation layer joined to one surface of the metal heat sink and including a circuit pattern provided on a surface of the high thermal conductive insulation layer, which surface is opposite to a surface joined to the metal heat sink;
   power semiconductor elements joined to the circuit pattern;
   a wiring metal plate for electrically connecting between the power semiconductor elements and between the power semiconductor elements and the circuit pattern;
   cylindrical main terminals that are joined, substantially perpendicularly, to the wiring metal plate and the circuit pattern, respectively;
   a cylindrical control terminal that is joined, substantially perpendicularly, to one of the power semiconductor elements; and
   transfer molding resin for sealing, at least, the high thermal conductive insulation layer, the circuit pattern, the power semiconductor elements, the wiring metal plate, outer side surfaces of the main terminals, and an outer side surface of the control terminal, wherein
   the main and control terminals each have an opening provided at a surface of the transfer molding resin.

2. The power semiconductor module according to claim 1, wherein
   the circuit pattern is a single metal pattern,
   one set of an IGBT chip and a FWD chip are mounted on the metal pattern as the power semiconductor elements,
   the IGBT chip and the FWD chip are connected to each other by the wiring metal plate,
   the main terminals are joined to the wiring metal plate and the metal pattern, respectively, and
   the control terminal is joined to a gate of the IGBT chip.

3. The power semiconductor module according to claim 1, wherein
   the circuit pattern includes a first metal pattern and a second metal pattern,
   a first IGBT chip and a first FWD chip are mounted on the first metal pattern as the power semiconductor elements,
   a second IGBT chip and a second FWD chip are mounted on the second metal pattern as the power semiconductor elements,
   the first IGBT chip and the first FWD chip are connected to each other by a first wiring metal plate,
   the second IGBT chip, the second FWD chip, and the first metal pattern are connected to each other by a second wiring metal plate,
   the main terminals are joined to the first wiring metal plate, the second wiring metal plate, and the second metal pattern, respectively, and
   the control terminals are joined to gates of the first IGBT chip and the second IGBT chip, respectively.

4. The power semiconductor module according to claim 2, wherein
   a wiring metal plate is joined to the gate of each IGBT chip, and
   each control terminal is joined to the wiring metal plate.

5. The power semiconductor module according to claim 3, wherein
   a wiring metal plate is joined to the gate of each IGBT chip, and
   each control terminal is joined to the wiring metal plate.

6. The power semiconductor module according to claim 1, wherein the circuit substrate is a metal substrate including: a metal base plate that is the metal heat sink; an insulation sheet that is the high thermal conductive insulation layer joined to one surface of the metal base plate; and the circuit pattern provided on a surface of the insulation sheet, which surface is opposite to a surface joined to the metal base plate.

7. The power semiconductor module according to claim 1, wherein the circuit substrate is a ceramic substrate including: a ceramic plate that is the high thermal conductive insulation layer; a heat-dissipating metal plate that is the metal heat sink joined to one surface of the ceramic plate; and the circuit pattern provided on another surface of the ceramic plate.

8. The power semiconductor module according to claim 1, wherein an external terminal pin is inserted and connected to each of the main and control terminals each having the opening provided at the surface of the transfer molding resin.

9. The power semiconductor module according to claim 8, wherein the external terminal pin is one selected from the group consisting of a first external terminal pin whose upper portion has a coil spring shape, a second external terminal pin whose upper portion has a plate spring shape, a third external terminal pin whose upper portion has a shape for solder connection, and a fourth external terminal pin whose upper portion has a shape for press-fit connection.

* * * * *